US012593526B2

(12) United States Patent
Ding et al.

(10) Patent No.: US 12,593,526 B2
(45) Date of Patent: Mar. 31, 2026

(54) CONTINUOUS STRING WELDING DEVICE FOR PHOTOVOLTAIC CELLS AND WELDING METHOD

(71) Applicant: TRINA SOLAR CO., LTD, Jiangsu (CN)

(72) Inventors: Zhiqiang Ding, Changzhou (CN); Junlong Hu, Changzhou (CN); Hao Tang, Changzhou (CN); Yun Peng, Changzhou (CN)

(73) Assignee: TRINA SOLAR CO., LTD., Changzhou (CN)

( * ) Notice: Subject to any disclaimer, the term of this patent is extended or adjusted under 35 U.S.C. 154(b) by 46 days.

(21) Appl. No.: 18/540,438

(22) Filed: Dec. 14, 2023

(65) Prior Publication Data

US 2024/0113250 A1 Apr. 4, 2024

(30) Foreign Application Priority Data

Dec. 19, 2022 (CN) .......................... 202211632225.X

(51) Int. Cl.
*B23K 20/00* (2006.01)
*B23K 20/12* (2006.01)
(Continued)

(52) U.S. Cl.
CPC ....... *H10F 71/1375* (2025.01); *B23K 20/002* (2013.01); *B23K 20/126* (2013.01); *B23K 2101/36* (2018.08)

(58) Field of Classification Search
CPC ............ B23K 2101/36; B23K 2101/40; B23K 37/047; H10F 71/1375; H10F 19/902; H10F 19/90; H05K 2201/10143
See application file for complete search history.

(56) References Cited

U.S. PATENT DOCUMENTS 6,196,445 B1 * 3/2001 Fogal ...................... H01L 24/78
228/180.5
7,677,431 B2 * 3/2010 Wong ...................... H01L 24/85
228/180.5
(Continued)

FOREIGN PATENT DOCUMENTS

CN 115000242 A 9/2002
CN 110137311 A 8/2019
(Continued)

OTHER PUBLICATIONS

European Patent Office, Extended Search Report issued in corresponding Application No. 23217662.8, dated May 29, 2024, 6 pp.
(Continued)

*Primary Examiner* — Erin B Saad
(74) *Attorney, Agent, or Firm* — Taft, Stettinius & Hollister LLP

(57) ABSTRACT

The present disclosure discloses a continuous string welding device for photovoltaic cells and a welding method. The device includes a power transmission mechanism and a welding light box. The power transmission mechanism includes a welding strip positioning section, a buffering section and a welding section that perform conveying independently from each other in sequence in the conveying direction. The buffering section is capable of storing at least one string of cells. The welding light box is located in the welding section. The welding strip positioning section performs step-by-step motion conveying. The welding section performs continuous motion conveying. The buffering section is configured to receive a predetermined number of cells from the welding strip positioning section, connect the predetermined number of cells in series, and then convey the predetermined number of cells connected in series to the welding section.

10 Claims, 6 Drawing Sheets

(51) Int. Cl.
 *H10F 71/00* (2025.01)
 *B23K 101/36* (2006.01)

(56) References Cited

U.S. PATENT DOCUMENTS

| | | | | |
|---|---|---|---|---|
| 8,561,878 B2 * | 10/2013 | Schultz | ............... | B23K 1/0016 |
| | | | | 228/49.1 |
| 9,673,349 B2 * | 6/2017 | Kodama | ................. | H10F 19/90 |
| 10,741,716 B2 * | 8/2020 | Lee | .......................... | H10F 71/00 |
| 2003/0127124 A1 * | 7/2003 | Jones | .................. | H10F 71/1375 |
| | | | | 136/244 |
| 2008/0048007 A1 * | 2/2008 | Chikaki | ............... | B23K 1/0008 |
| | | | | 228/101 |
| 2009/0077805 A1 * | 3/2009 | Bachrach | .............. | H10F 19/902 |
| | | | | 29/729 |
| 2010/0047954 A1 * | 2/2010 | Su | ...................... | H01L 21/67712 |
| | | | | 118/620 |
| 2011/0017281 A1 * | 1/2011 | Funakoshi | ............ | H10F 19/908 |
| | | | | 136/251 |
| 2011/0048491 A1 * | 3/2011 | Taira | ..................... | H10F 19/904 |
| | | | | 257/E31.124 |
| 2011/0048492 A1 * | 3/2011 | Nishiwaki | ............. | H10F 19/902 |
| | | | | 156/60 |
| 2011/0056532 A1 * | 3/2011 | Ravi | ................... | H10F 71/1395 |
| | | | | 257/E31.119 |
| 2011/0300664 A1 * | 12/2011 | Chung | ................. | H10F 19/906 |
| | | | | 257/E31.117 |
| 2012/0042925 A1 * | 2/2012 | Pfennig | ................. | H10F 19/904 |
| | | | | 136/244 |
| 2012/0080507 A1 * | 4/2012 | Luechinger | ............ | B23K 20/10 |
| | | | | 228/110.1 |
| 2012/0085812 A1 * | 4/2012 | Luechinger | ......... | H10F 71/1375 |
| | | | | 228/110.1 |
| 2012/0214271 A1 * | 8/2012 | Ishii | ...................... | H10F 19/906 |
| | | | | 29/748 |
| 2015/0076214 A1 * | 3/2015 | Kodama | ............. | H10F 71/1375 |
| | | | | 228/49.5 |
| 2019/0198690 A1 * | 6/2019 | Guo | ...................... | H10F 71/103 |
| 2023/0006089 A1 * | 1/2023 | Li | ........................ | H10F 71/1375 |

FOREIGN PATENT DOCUMENTS

| | | |
|---|---|---|
| CN | 110660720 A | 1/2020 |
| CN | 110695580 A | 1/2020 |
| CN | 111192939 A | 5/2020 |
| CN | 111697106 A | 9/2020 |
| CN | 111755567 A | 10/2020 |
| CN | 212085031 U | 12/2020 |
| CN | 212705094 U | 3/2021 |
| CN | 111192939 B | 6/2021 |
| CN | 113828967 A | 12/2021 |
| CN | 114784144 A | 7/2022 |
| EP | 3444853 A2 | 2/2019 |
| JP | 2005236235 A | 9/2005 |
| JP | 2010225749 A | 10/2010 |
| JP | 2018046198 A | 3/2018 |
| WO | 2011049187 A1 | 4/2011 |

OTHER PUBLICATIONS

Australian Patent Office, Examination Report No. 1 issued in corresponding Application No. 2023282312, dated May 10, 2024, 6 pp.

Japanese Patent Office, Office Action issued in corresponding Application No. 2023-212858, dated Feb. 18, 2025, 3 pp.

Chinese Patent Office, First Office Action issued in corresponding Application No. 202211632225.X, dated Mar. 15, 2025, 16 pp.

\* cited by examiner

CONTINUOUS STRING WELDING DEVICE FOR PHOTOVOLTAIC CELLS AND WELDING METHOD

CROSS-REFERENCE TO RELATED APPLICATIONS

This application claims priority to China Patent Application No. 202211632225.X, filed on Dec. 19, 2022, the content of which is hereby incorporated by reference in its entirety.

TECHNICAL FIELD

The present disclosure relates to the technical field of photovoltaic design, and in particular to a continuous string welding device for photovoltaic cells and a welding method.

BACKGROUND

A photovoltaic cell string welding process in the process of manufacturing crystalline silicon photovoltaic modules refers specifically to connecting the cells end-to-end via positive and negative electrodes using photovoltaic welding strips in a certain number, direction and order, to form a cell string.

Currently, string welding machines of all brands perform wielding by mechanically aligning a welding strip with a main grid on a cell and a welding PAD spot, and then moving the cell to a welding station in a step-by-step manner. Mostly, during wielding, a welding mode with infrared heating is used, that is, one or more cells to be welded on the same strip enter the welding station in a step-by-step manner, and then, a light source of an infrared light box module is turned on for a certain period of time and then turned off. Then, the one or more cells move out of the welding station in another direction in a step-by-step manner, with the next one or more cells entering the welding station at the same time. Herein, the light source is turned on for a certain period of time, the period of time can be less than 1 second or more than 1 second. Depending on the welding process, the period of time can be set and controlled and has a typical value usually within in a range from 0.5 seconds to 10 seconds.

The basic operating steps of the above-mentioned conventional string welding machine are as follows. When the step-by-step advancement of the conveyor line is stopped, the front-end action mechanism transports the cells and the welding strip to a designated position on the conveyor line, and the welding strip and the cells are positioned in place in advance. At the same time, the welding is prepared for the cells at the welding station. After the actions of the two stations are completed, the conveyor line advances some distance in a step-by-step manner. Then, the above actions are repeated.

In this operating mode, the welding light box needs to be turned on and off frequently, resulting in unstable temperature in the welding zone and thus large fluctuations in welding quality. Since the heating source (usually a set of infrared heating lamps) is quickly turned on and off for each welding, the temperature of the welding zone rises and falls rapidly, making it impossible to achieve effective and smooth monitoring and closed-loop control. This causes the temperature of the entire welding zone to become a monitoring blind spot, which often requires technically capable and experienced personnel to debug the device and process windows, affecting the production yield and the availability time of the device, that is, affecting the Uptime of the device.

In the prior art, the string welding machine has been proposed to connect the cells in series and then conveys them to the welding light box, but the machine adopts a relatively complex structure, resulting in that the precision requirements for processing and subsequent maintenance costs of the machine would be significantly increased.

therefore, there is a demand for designing a string welding machine with a simple structure that can realize continuous welding and improve the production yield to solve the above technical problems at present.

SUMMARY

According to various embodiments, the present disclosure provides a continuous string welding device for photovoltaic cells and a welding method.

The present disclosure provides a continuous string welding device for photovoltaic cells, including: a power transmission mechanism including a welding strip positioning section, a buffering section, and a welding section that perform conveying independently from each other in sequence in a conveying direction; and a welding light box located in the welding section. The buffering section is capable of storing at least one string of cells. The welding strip positioning section performs step-by-step motion conveying. The welding section performs continuous motion conveying. The buffering section is configured to receive a predetermined number of cells from the welding strip positioning section, connect the predetermined number of cells in series, and then convey the predetermined number of cells connected in series to the welding section.

In an embodiment, the welding strip positioning section, the buffering section and the welding section each include: a conveyor frame; an endless conveyor belt; a driving wheel and a driven wheel that are rotatably connected to the conveyor frame; and a drive motor that drives the driving wheel to rotate. The driving wheel and the driven wheel are located at both ends of the endless conveyor belt respectively.

In an embodiment, a surface of the endless conveyor belt is provided with a plurality of negative pressure holes.

In an embodiment, the continuous string welding device for photovoltaic cells further includes a cell transporting mechanism, a welding strip clamping mechanism, a welding strip straightening mechanism, and a pressure tool. The cell transporting mechanism transports the cells to the welding strip positioning section. The welding strip clamping mechanism and the welding strip straightening mechanism are arranged on the welding strip positioning section in the conveying direction and are adapted for clamping the welding strip. The pressure tool is located right above the welding strip positioning section and is capable of being pressed against on the cell.

In an embodiment, the welding light box includes a box body and a plurality of infrared lamps located in the box body. A plurality of temperature sensors are disposed in the box body.

In an embodiment, the pressure tool includes a pressure plate and a plurality of spring pressure heads located below the pressure plate. The spring pressure heads are capable of being in contact with the welding strip.

In an embodiment, the pressure plate has a plurality of through holes extending therethrough.

In an embodiment, the buffering section switches operation between step-by-step motion conveying and continuous motion conveying.

The present disclosure further provides a welding method, which uses the above-mentioned continuous string welding device for photovoltaic cells and includes: S1, feeding, wherein a welding strip and a cells are placed and positioned in place on the welding strip positioning section when conveying is paused; S2, step-by-step conveying, wherein a predetermined number of cells are conveyed from the welding strip positioning section to the buffering section in a step-by-step manner until at least one cell string is formed on the buffering section, and during the step-by-step conveying, the cell string is not conveyed from the buffering section to the welding section; S3, continuous conveying, wherein the cell string is conveyed continuously from the buffering section to the welding section, and during the continuous conveying, a new cell is not conveyed from the welding strip positioning section to the buffering section; S4, welding; wherein the cell string is welded in the welding light box; and S5: performing steps S1 to S4 repeatedly until the cells are all welded.

In an embodiment, in S2, the buffering section performs a step-by-step motion with the same conveying speed and frequency as the welding strip positioning section. In S3, the buffering section performs a continuous motion with the same conveying speed as the welding section.

BRIEF DESCRIPTION OF THE ACCOMPANY DRAWINGS

The present disclosure will be further described below in conjunction with the accompanying drawings and embodiments.

Figure 1:
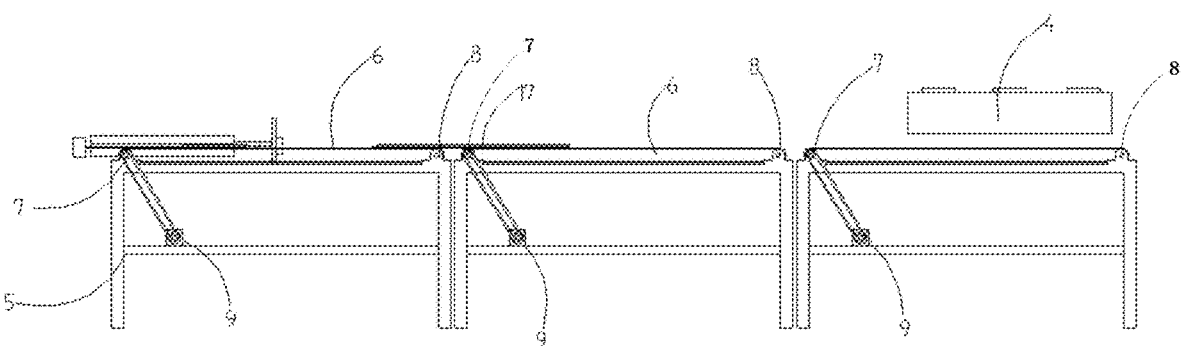
FIG. 1 is a front view of a continuous string welding device for photovoltaic cells in a first state according to the present disclosure.

In figures: 1. welding strip positioning section, 2. buffering section, 3. welding section, 4. welding light box, 401. box body, 402. infrared lamp, 5. conveyor frame, 6. endless conveyor belt, 7. driving wheel, 8. driven wheel, 9. drive motor, 10. cell transporting mechanism, 11. welding strip clamping mechanism, 12. welding strip straightening mechanism, 1201. pressure rod, 1202. lifting cylinder, 13.

pressure tool, 1301. pressure plate, 1302. spring pressure head, 14. cell, 15. negative pressure hole, 16. through hole, 17. first cell string, 18. second cell string, 19. third cell string, 20. fourth cell string, 21. welding strip.

DETAILED DESCRIPTION

Embodiments of the present disclosure are described in detail below, examples of which are illustrated in the accompanying drawings. The same or similar reference numerals throughout the drawings denote the same or similar elements or elements with the same or similar functions. The embodiments described below with reference to the accompanying drawings are exemplary and only used for explaining, but are not understood as limiting the present disclosure.

Embodiment 1

As shown in FIGS. 1 to 11, a continuous string welding device for photovoltaic cells includes a power transmission mechanism and a welding light box 4. The power transmission mechanism includes a welding strip positioning section, a buffering section 2, and a welding section 3 that perform conveying independently from each other in sequence in a conveying direction. The buffering section 2 is capable of storing at least one string of cells 14. The welding light box 4 is located in the welding section 3. The welding strip positioning section performs step-by-step conveying. The welding section 3 performs continuous conveying. The buffering section 2 is configured to receive a predetermined number of cells 14 from the welding strip positioning section 1, connect the predetermined number of cells in series, and then convey the cells connected in series to the welding section 3.

The welding strip positioning section, the buffering section 2, and the welding section 3 all have a conveying structure for conveying the cells 14, and can be conveyor belts or conveyor rollers. The welding strip positioning section is a feeding section configured for feeding the cells 14 and the welding strips 21. When the cells 14 and the welding strips 21 are preliminarily aligned, since the cells 14 and the welding strips 21 need to be feeded one by one and are in a stationary state when preliminarily aligned, the feeding mode adopts a step-by-step manner. The buffering section 2 is configured to store cells 14. Once there are one or more strings of cells 14 on the buffering section 2, the one or more strings of cells 14 will be conveyed to the welding section 3. When the aligned cells 14 and the welding strips 21 are stored in the buffering section 2, the buffering section 2 is connected to the welding strip positioning section 1 by step-by-step advancing. After the cells 14 in a string are all aligned with the corresponding welding strip, the cells 14 in a string are continuously conveyed to the welding section 3 at one time. The welding section 3 performs continuous conveying at a constant speed. In the prior art, the string welding machine conveys the cells to the welding light box in a step-by-step manner, with a relatively large conveying time interval for each cell, so the welding light box can only be turned on after a string of the cells is aligned with the welding strip. However, the present disclosure allows a cell string to pass through the buffering section after being placed and clamped on the welding strip positioning section, so that the cell string can pass through the welding light box 4 during continuous advancement. The welding heating source (usually a set of infrared lamps 402) does not need to be turned on and off (i.e., to increase or decrease the temperature) frequently, ensuring that the period of time taken by the cells 14 and heating of the cells 14 when passing through the welding light box 4 are consistent and even. In addition, the present disclosure realizes continuous conveying to the welding section 3 through three sections of conveying structures with different power forms, which has a simple structure and low maintenance cost.

In this embodiment, the welding strip positioning section, the buffering section 2, and the welding section 3 each include: a conveyor frame 5; an endless conveyor belt 6; a driving wheel 7 and a driven wheel 8 that are rotatably connected to the conveyor frame 5; and a drive motor 9 that drives the driving wheel 7 to rotate. The drive motor 9 of the welding strip positioning section is a stepper motor. The drive motor 9 of the buffering section 2 is a motor that switches between a step-by-step motion and a continuous motion. The drive motor 9 of the welding section 3 is a continuous motion motor. The driving wheel 7 and the driven wheel 8 are located at both ends of the endless conveyor belt 6 respectively. The driving motor 9 drives the driving wheel 7 to rotate, thereby causing the endless conveyor belt 6 to rotate, and the endless conveyor belt 6 then drives the driven wheel 8 to rotate. The drive motor 9 can be directly connected to the driving wheel 7, or indirectly drive through a conveyor belt, the driving wheel 7 to rotate. In this case, the drive motor 9 can be arranged on a lower portion of the conveyor frame 5.

The welding strip positioning section 1 further includes some devices due for mainstream welding machines, such as a cell transporting mechanism 10, a welding strip clamping mechanism 11, a welding strip straightening mechanism 12, and a pressure tool 13. The cell transporting mechanism 10 transports the cells 14 to the welding strip positioning section. The welding strip clamping mechanism 11 and the welding strip straightening mechanism 12 are arranged on the welding strip positioning section in the conveying direction and are adapted for clamping the welding strip 21. The pressure tool 13 is located right above the welding strip positioning section and can be pressed against on the cell 14. The cell transporting mechanism 10 may be a transporting robot. The welding strip clamping mechanism 11 is located at the end of the welding strip positioning section where the welding strip 21 is feeded into the welding strip positioning section, and is configured to press the end of the welding strip 21 after the welding strip 21 is conveyed to the welding strip positioning section. The end of the welding strip 21 may be pressed by using a telescopic cylinder. The welding strip straightening mechanism 12 is located between the welding strip clamping mechanism 11 and a position at which the cell 14 is aligned with the welding strip 21, to prevent the welding strip 21 from bending. The welding strip straightening mechanism 12 may include a pressure rod 1201 and a lifting cylinder 1202 that drives the pressure rod 1201 to perform lifting movement. The pressure rod 1201 is pressed against on the welding strip 21. A translation cylinder that drives the pressure rod 1201 to move in the conveying direction may also be further provided to adjust the position of the pressure rod 1201 in the conveying direction.

Figure 4:
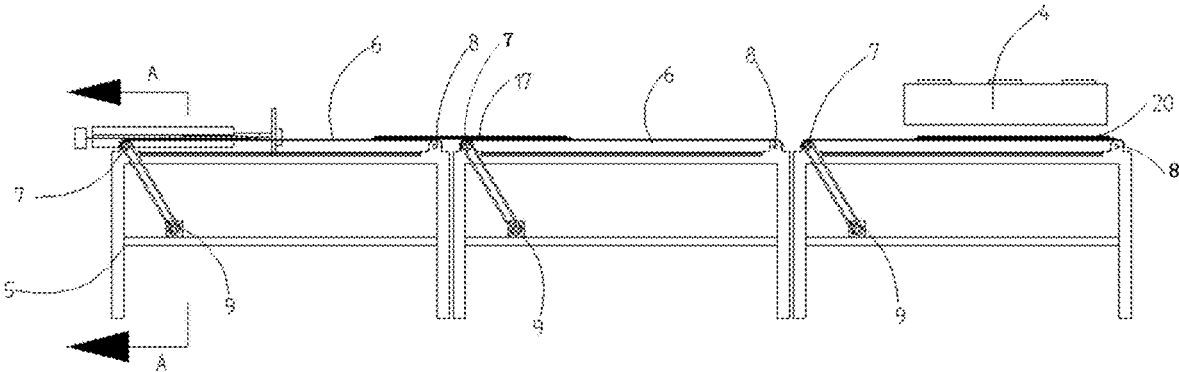
FIG. 4 is a front view of the continuous string welding device for photovoltaic cells in a third state according to the present disclosure.

The cell string and the pressure tool in FIG. 4 are clamped by the welding strip clamping mechanism 11 and the welding strip straightening mechanism 12 and then conveyed from the welding strip positioning section to the buffering section, thereby not affecting the continuous conveying to the welding section 3.

Figure 11:
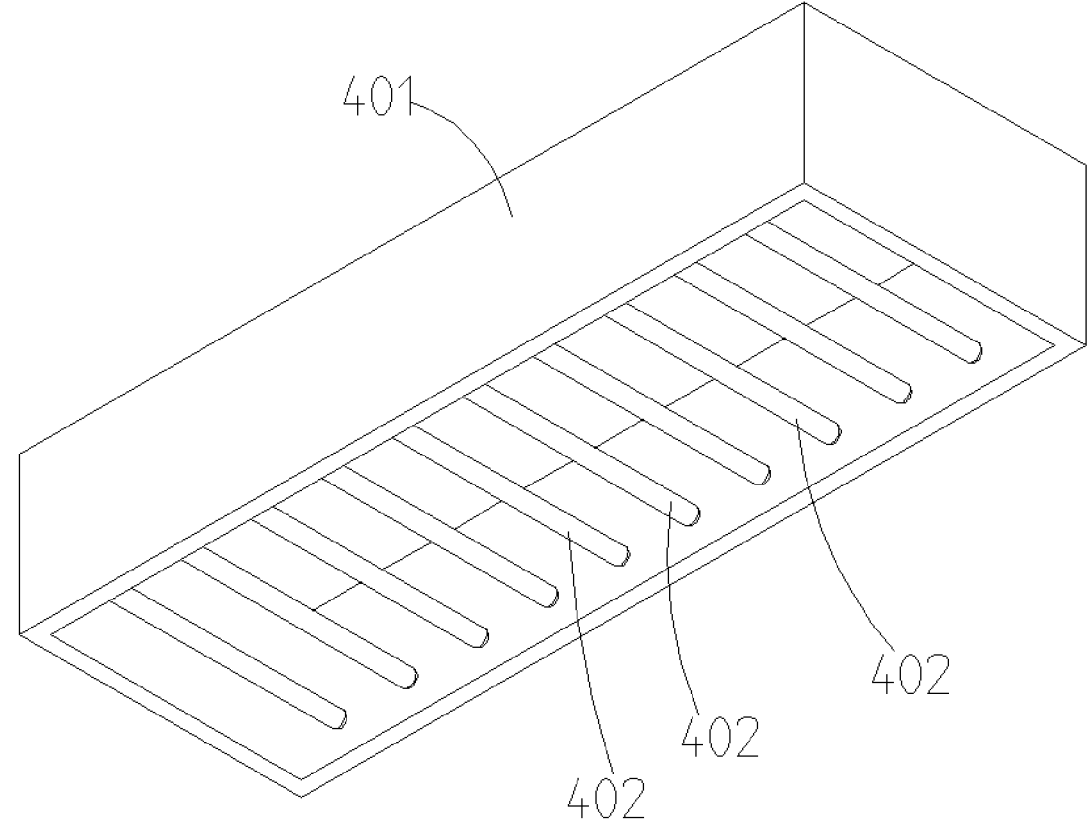
FIG. 11 is a perspective view of a welding light box according to the present disclosure.

The welding light box 4 adopts conventional radiant heating to achieve preheating, welding and slow cooling of the cell string, and mainly includes a box body 401 and a plurality of infrared lamps 402 located in the box body 401 (as shown in FIG. 11).

Figure 9:
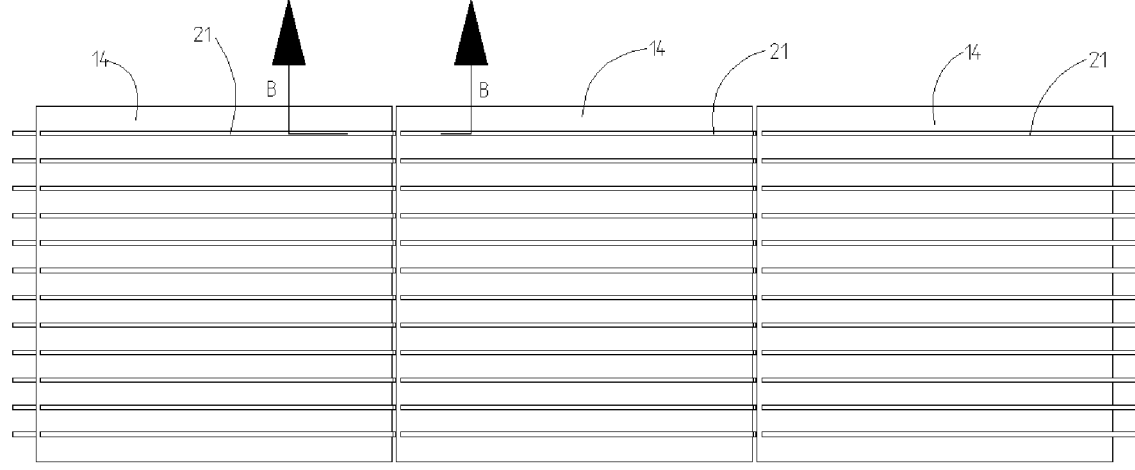
FIG. 9 is a schematic diagram of a connection structure between cells and a welding strip according to the present disclosure.
Figure 10:
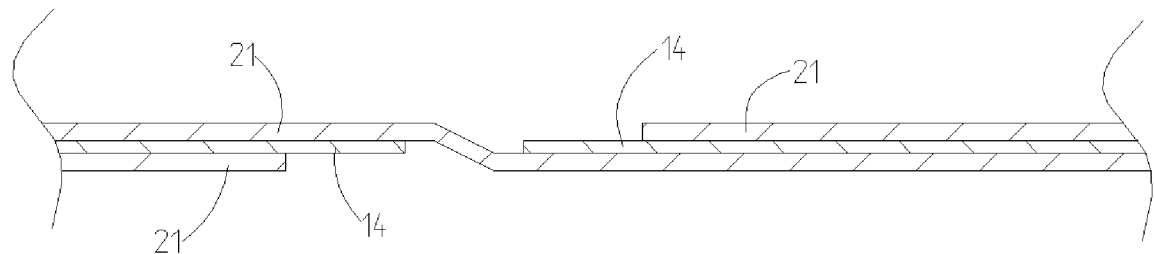
FIG. 10 is a cross-sectional view taken along a line B-B in FIG. 9.

The cells 14 in the present disclosure may be welded on both sides, that is, the front and back sides of the cell 14 are covered with the welding strips 21 respectively, which is a common connection method, and the specific arrangement is shown in FIG. 10. In a cell string, the welding strip 21 on the front side (i.e., the upper surface) of the current tell 14 extends from the welding strip 21 attached to the back side of the previous cell 14, and the welding strip 21 on the back side of the current cell 14 extends to attach the next cell 14 (as shown in FIGS. 9 and 10).

Embodiment 2

Figure 8:
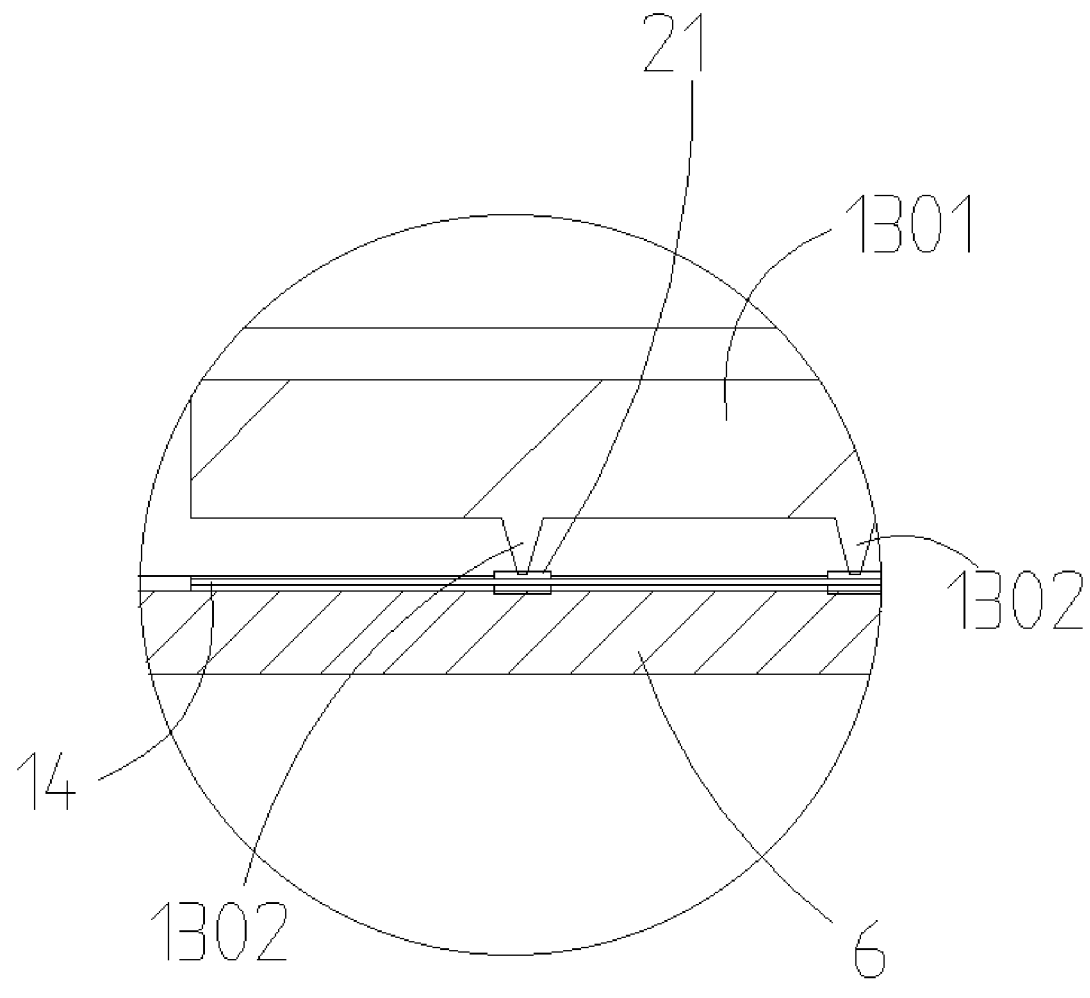
FIG. 8 is an enlarged view of portion b in FIG. 7.

On the basis of Embodiment 1, the cells 14 and the welding strips 21 in this embodiment are positioned as follows. The pressure tool 13 includes a pressure plate 1301 and a plurality of spring pressure heads 1302 located below the pressure plate 1301. The spring pressure heads 1302 can be in contact with the welding strip 21. The front welding strip 21 is directly placed on the front side of the cell 14, and is then pressed by the pressure tool 13. In a further design, a surface of the endless conveyor belt 6 is provided with a plurality of negative pressure holes 15 that are configured for sucking the cells 14 to the back welding strip 21. Since the pressure tool 13 is pressed against on the front side of the cell string, and the negative pressure holes 15 are arranged on the back side for suck and fixation, the positioning accuracy of the cell string can be well maintained. As shown in FIG. 8, it can be seen that the pressure plate 1301 has the plurality of spring pressure heads 1302 that are configured for positioning the welding spots.

In order to reduce the weight of the pressure plate 1301 and prevent the cells 14 from being damaged due to excessive pressure, it is preferred that the pressing plate 1301 has a plurality of through holes 16 extending therethrough.

Embodiment 3

On the basis of the above embodiments, a plurality of temperature sensors are disposed in the box body 401. The temperature sensors are distributed and controlled at multiple points to make the temperature in the entire effective welding area of the welding zone uniform.

Embodiment 4

A welding method is provided, which uses the above-mentioned continuous string welding device for photovoltaic cells 14, includes the following steps: S1: feeding, wherein the welding strip 21 and the cells 14 are placed and positioned in place on the welding strip positioning section when conveying is paused; S2: step-by-step conveying, wherein a predetermined number of cells 14 is conveyed from the welding strip positioning section to the buffering section 2 in a step-by-step manner, until at least one cell string is formed on the buffering section 2, and during step S2, the cell string is not conveyed from the buffering section 2 to the welding section 3; S3: continuous conveying, wherein the cell strings are continuously conveyed from the buffering section 2 to the welding section 3, and during step S3, and a new cell 14 is not conveyed from the welding strip positioning section to the buffering section 2; S4: welding, wherein the cell string is welded in the welding light box 4; and S5: performing steps S1 to S4 repeatedly until the cells 14 are all welded.

Further, in step S2, the buffering section performs a step-by-step motion with the same conveying speed and frequency as the welding strip positioning section. In step S3, the buffering section performs a continuous motion with the same conveying speed as the welding section 3.

In the illustration of the present disclosure, there are three or more cells 14 welded in series on each section of the power transmission mechanism. In practice, there may be one or more strings on each section of the conveyor belt depending on the production requirements. A working process of the present disclosure is described below, which includes three typical states as follows.

Figure 5:
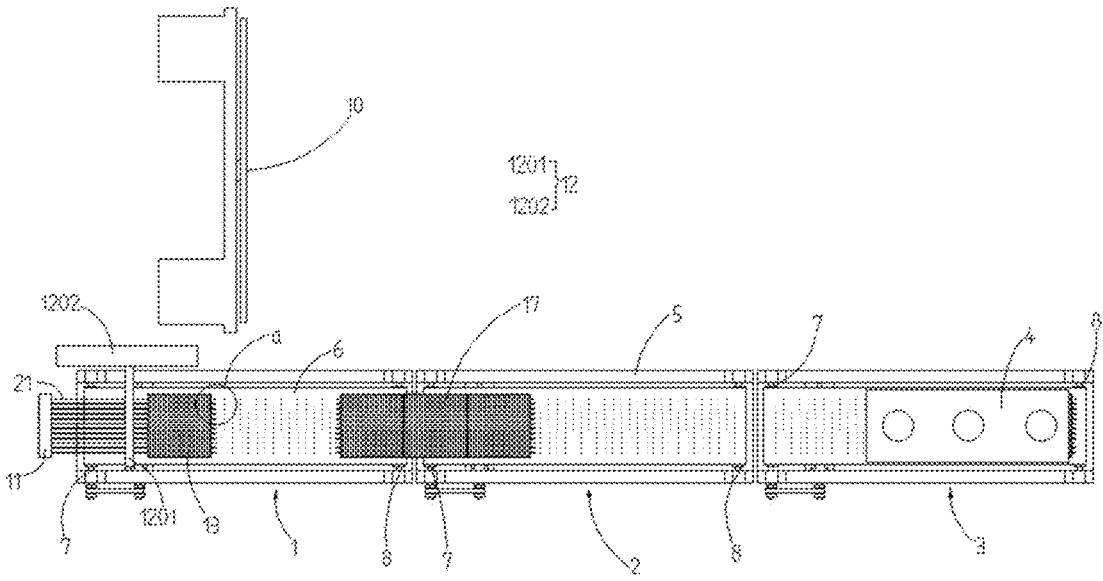
FIG. 5 is a top view of the continuous string welding device for photovoltaic cells in the first state or the second state according to the present disclosure.
Figure 6:
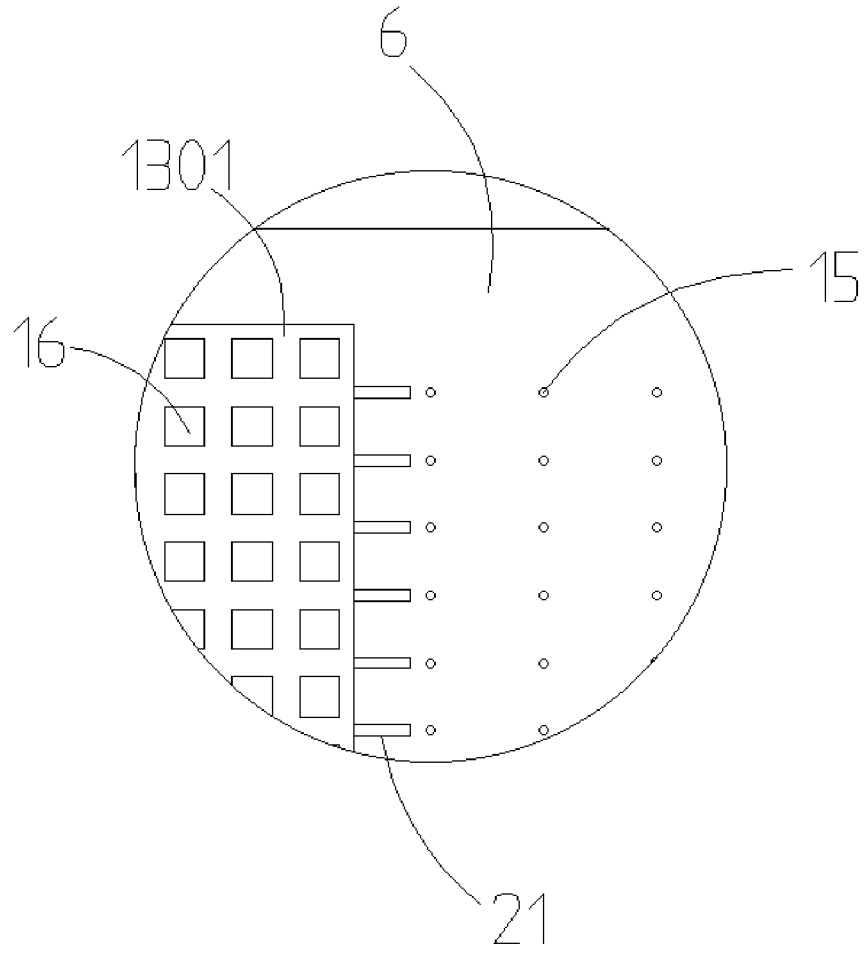
FIG. 6 is an enlarged view of portion a in FIG. 5.
Figure 7:
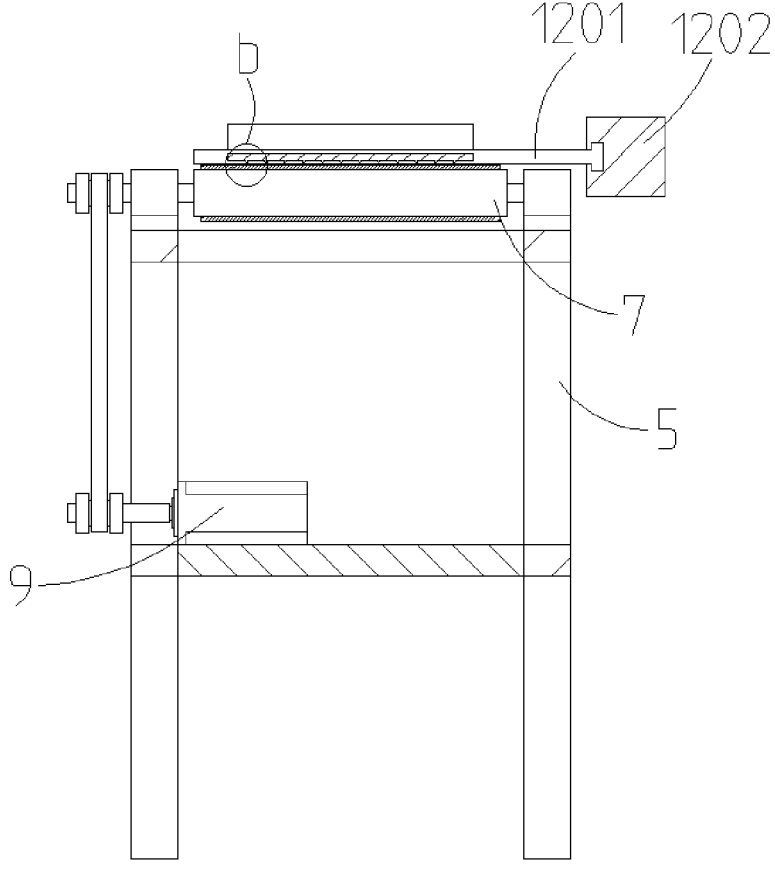
FIG. 7 is a cross-sectional view taken along a line A-A in FIG. 4.

A first state: as shown in FIGS. 1 and 5, the welding strip positioning section and the buffering section perform step-by-step motion conveying, and the welding section 3 performs continuous motion conveying. A first cell string 17 connected in series is at a transitional conveying stage between the welding strip positioning section and the buffering section, and at the same time, the welding strip straightening mechanism 12 still continuously positions and arranges the cells 14 and welding strips 21.

Figure 2:
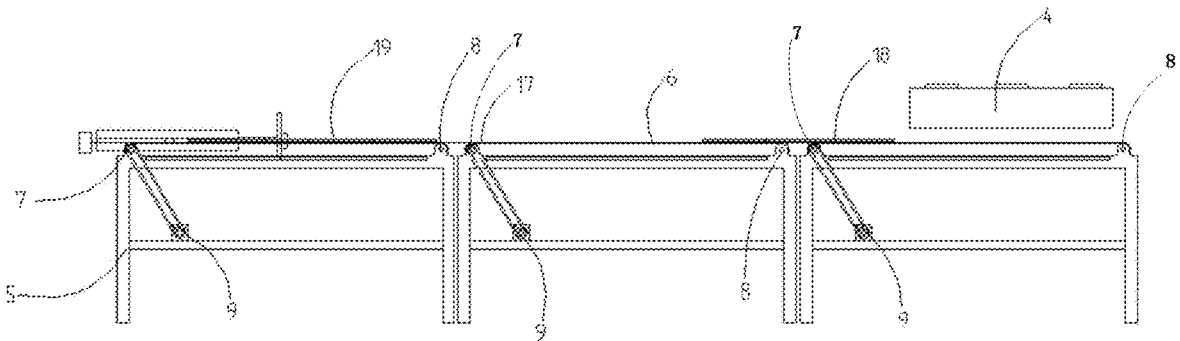
FIG. 2 is a front view of the continuous string welding device for photovoltaic cells in a second state according to the present disclosure.
Figure 3:
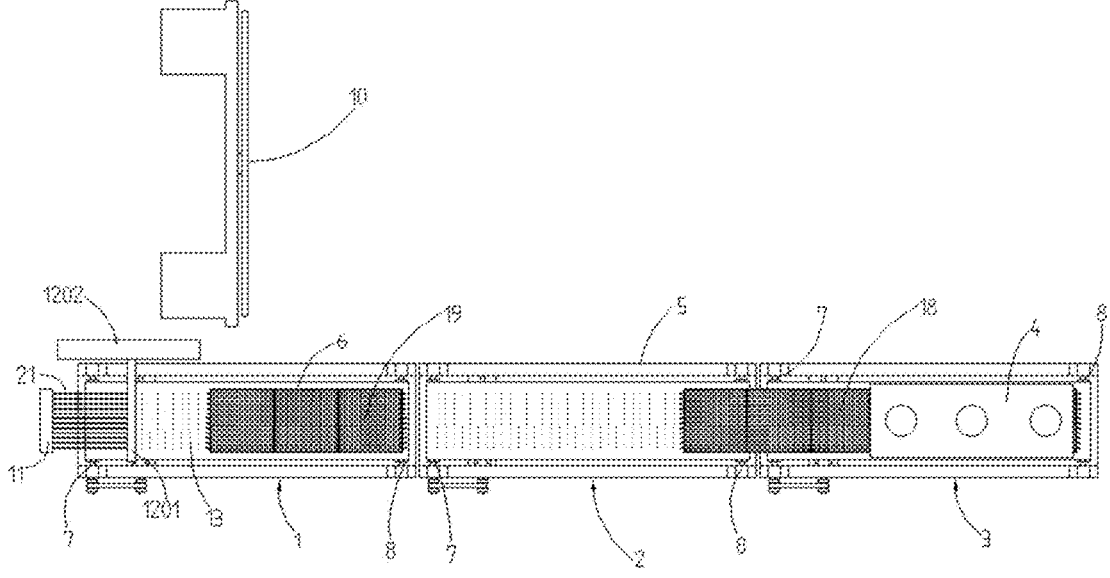
FIG. 3 is a top view of the continuous string welding device for photovoltaic cells in the second state according to the present disclosure.

A second state: as shown in FIGS. 2 and 3, the welding strip positioning section performs step-by-step motion conveying, and the welding section 3 and the buffering section perform continuous motion conveying. A second cell string 18 connected in series is at a transitional conveying stage between the buffering section and the welding section 3, and a third cell string 19 connected in series is in a waiting-to-convey stage in the welding strip positioning section 1.

A third state: as shown in FIGS. 4 and 5, the welding strip positioning section performs step-by-step motion conveying, the welding section 3 performs continuous motion conveying, and the buffer section begins to switch from continuous motion conveying to step-by-step motion conveying. The first cell string 17 connected in series is at a transitional conveying stage between the welding strip positioning section and the buffering section, and a fourth cell string 17 connected in series is welded in the welding light box 4.

The continuous string welding device for photovoltaic cells and the welding method according to the present disclosure can solve the technical problem of unstable temperature in the welding zone and thus large fluctuations in welding quality, which affects the production yield and the availability time of the device.

The present disclosure has the following beneficial effects.

(1) The continuous string welding device for photovoltaic cells and the welding method of the present disclosure adopts three sections of conveyor structures independent from each other. The feeding part and the welding part are separated from each other by adjusting power outputs thereof to be different. A specified number of cells are stored in the intermediate buffering section and then conveyed to the welding section at one time, thereby achieving continuous conveying to the welding section. The welding light box can be kept on to ensure that different cells and different areas of the same cell are welded under the same conditions, improving the uniformity and stability of welding.

(2) In the present disclosure, the elastic compression at the upper side and the negative pressure suck at the lower side are used to realize the positioning of the cells, so the bonding effect between the cell and the welding strip is more better.

In the description of the present disclosure, it should be understood that the terms "first", "second", and the like are used for descriptive purposes only and shall not be understood as indicating or implying the relative importance. Furthermore, in the description of the present disclosure, "a plurality of" means two or more unless otherwise specified.

In this specification, schematic expressions of the terms are not necessarily referring to the same embodiment. Furthermore, the specific features, structures, materials, or characteristics described may be combined in any suitable manner in any one or more embodiments.

Inspired by the above-mentioned preferred embodiments of the present disclosure and based on the above description, the skilled one in the related art can make various changes and modifications without departing from the scope of the technical idea of the present disclosure. The technical scope of the present disclosure is not limited to the content in the description, and shall be determined based on the scope of the claims.

What is claimed is:

1. A continuous string welding device for photovoltaic cells, comprising:
   a power transmission mechanism comprising a welding strip positioning section, a buffering section, and a welding section that perform conveying independently from each other in sequence in a conveying direction; and
   a welding light box located in the welding section,
   wherein the buffering section is capable of storing at least one string of cells, the welding strip positioning section performs step-by-step motion conveying, and the welding section performs continuous motion conveying; and
   the buffering section is configured to receive a predetermined number of cells from the welding strip positioning section, connect the predetermined number of cells in series, and then convey the predetermined number of cells connected in series to the welding section.

2. The continuous string welding device for photovoltaic cells according to claim 1, wherein the welding strip positioning section, the buffering section, and the welding section each includes:
   a conveyor frame;
   an endless conveyor belt;
   a driving wheel and a driven wheel that are rotatably connected to the conveyor frame; and
   a drive motor that drives the driving wheel to rotate,
   wherein the driving wheel and the driven wheel are located at each end of the endless conveyor belt, respectively.

3. The continuous string welding device for photovoltaic cells according to claim 2, wherein a surface of the endless conveyor belt is provided with a plurality of negative pressure holes.

4. The continuous string welding device for photovoltaic cells according to claim 3, further comprising:
   a cell transporting mechanism;
   a welding strip clamping mechanism;
   a welding strip straightening mechanism; and
   a pressure tool,
   wherein the cell transporting mechanism transports the cells to the welding strip positioning section;
   the welding strip clamping mechanism and the welding strip straightening mechanism are arranged on the welding strip positioning section in the conveying direction; and are adapted for clamping the welding strip; and the pressure tool is located right above the welding strip positioning section and is capable of being pressed against on the cell.

5. The continuous string welding device for photovoltaic cells according to claim 1, wherein the welding light box includes:

a box body; and a plurality of infrared lamps located in the box body, wherein a plurality of temperature sensors are disposed in the box body.

6. The continuous string welding device for photovoltaic cells according to claim 4, wherein the pressure tool includes:

a pressure plate; and a plurality of spring pressure heads located below the pressure plate, wherein the spring pressure heads are capable of being in contact with the welding strip.

7. The continuous string welding device for photovoltaic cells according to claim 6, wherein the pressure plate has a plurality of through holes extending therethrough.

8. The continuous string welding device for photovoltaic cells according to claim 1, wherein the buffering section switches operation between step-by-step motion conveying and continuous motion conveying.

9. A welding method, using the continuous string welding device for photovoltaic cells according to claim 1, comprising:

S1, feeding, wherein a welding strip and a cell are placed and positioned in place on the welding strip positioning section when conveying is paused;

S2: step-by-step conveying, wherein a predetermined number of cells are conveyed from the welding strip positioning section to the buffering section in a step-by-step manner until at least one cell string is formed on the buffering section, and during the step-by-step conveying, the cell string is not conveyed from the buffering section to the welding section;

S3: continuous conveying, wherein the cell string is conveyed continuously from the buffering section to the welding section, and during the continuous conveying, a new cell is not conveyed from the welding strip positioning section to the buffering section;

S4: welding; wherein the cell string is welded in the welding light box; and

S5: performing steps S1 to S4 repeatedly until the cells are all welded.

10. The welding method according to claim 9, wherein in S2, the buffering section performs a step-by-step motion with the same conveying speed and frequency as the welding strip positioning section, and in S3, the buffering section performs a continuous motion with the same conveying speed as the welding section.

* * * * *